United States Patent
Laparra et al.

(10) Patent No.: US 6,319,796 B1
(45) Date of Patent: Nov. 20, 2001

(54) MANUFACTURE OF AN INTEGRATED CIRCUIT ISOLATION STRUCTURE

(75) Inventors: Olivier Laparra, San Jose, CA (US); Ramiro Solis, Andera, TX (US); Hunter Brugge; Michela S. Love, both of San Antonio, TX (US); Bijan Moslehi, Stanford; Milind Weling, San Jose, both of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/377,043

(22) Filed: Aug. 18, 1999

(51) Int. Cl.$^7$ .................................................. H01L 21/76
(52) U.S. Cl. ..................... 438/435; 438/424; 438/437; 148/DIG. 50
(58) Field of Search ...................... 438/424, 425, 438/426, 427, 435, 437; 148/DIG. 50

(56) References Cited

U.S. PATENT DOCUMENTS

| | | | |
|---|---|---|---|
| 4,038,171 | 7/1977 | Moss et al. | 204/298 |
| 4,515,652 | 5/1985 | Gimpelson et al. | 156/643 |
| 4,594,769 | 6/1986 | Ellwanger | 29/578 |
| 5,089,442 | 2/1992 | Olmer | 432/235 |
| 5,397,962 | 3/1995 | Moslehi | 315/111.51 |
| 5,421,891 | 6/1995 | Campbell et al. | 118/723 R |
| 5,429,711 | 7/1995 | Wantanabe et al. | 216/52 |
| 5,441,094 | 8/1995 | Pasch | 156/636.1 |
| 5,492,858 | 2/1996 | Bose et al. | 437/67 |
| 5,494,854 | 2/1996 | Jain | 437/195 |
| 5,494,857 | 2/1996 | Cooperman et al. | 437/228 |
| 5,506,168 | 4/1996 | Morita et al. | 437/67 |
| 5,560,802 | 10/1996 | Chisholm | 156/636.1 |
| 5,604,149 | 2/1997 | Paoli et al. | 437/67 |
| 5,639,697 | 6/1997 | Weling et al. | 437/225 |
| 5,665,202 | 9/1997 | Subramanian et al. | 438/692 |
| 5,686,356 | 11/1997 | Jain et al. | 437/195 |
| 5,691,215 | 11/1997 | Dai et al. | 437/44 |
| 5,702,976 | 12/1997 | Schuegraf et al. | 437/67 |
| 5,702,977 | 12/1997 | Jang et al. | 437/67 |
| 5,710,076 | 1/1998 | Dai et al. | 438/305 |
| 5,712,185 | 1/1998 | Tsai et al. | 437/67 |
| 5,721,173 | 2/1998 | Yano et al. | 438/424 |
| 5,728,621 | 3/1998 | Zheng et al. | 438/427 |
| 5,728,631 | 3/1998 | Wang | 438/787 |
| 5,731,241 | 3/1998 | Jang et al. | 438/424 |

(List continued on next page.)

FOREIGN PATENT DOCUMENTS

| | | | | |
|---|---|---|---|---|
| 197 17 880 A1 | 5/1998 | (DE) | | H01L/21/765 |
| WO 97/24761 | 12/1996 | (WO) | | H01L/21/762 |
| WO 00/03430 | 1/2000 | (WO) | | H01L/21/762 |

*Primary Examiner*—Trung Dang
(74) *Attorney, Agent, or Firm*—Woodard, Emhardt, Naughton, Moriarty & McNett

(57) ABSTRACT

Disclosed are techniques to provide an integrated circuit, including the provision of improved integrated circuit isolation structures. The techniques include forming a number of trenches in an integrated circuit substrate to define a number of substrate regions that are to be electrically isolated from one another. A dielectric material is deposited in the trenches by exposure to a high density plasma having a first deposition-to-etch ratio. The high density plasma is adjusted to a second deposition-to-etch ratio greater than the first ratio to accumulate the dielectric material on the substrate after at least partially filling the trenches. A portion of the dielectric material is removed to planarize the workpiece. A number of components, such as insulated gate field effect transistors, may be subsequently formed in the substrate regions between the trenches.

27 Claims, 3 Drawing Sheets

U.S. PATENT DOCUMENTS

| | | | |
|---|---|---|---|
| 5,736,423 | 4/1998 | Ngo | 437/238 |
| 5,741,740 | 4/1998 | Jang et al. | 438/435 |
| 5,788,869 | 8/1998 | Dalton et al. | 216/60 |
| 5,792,522 | 8/1998 | Jin et al. | 427/575 |
| 5,792,702 | 8/1998 | Liang | 438/624 |
| 5,851,899 * | 12/1998 | Weigand | 438/427 |
| 5,915,190 * | 6/1999 | Pirkle | 438/424 |
| 5,920,792 | 7/1999 | Lin | 438/633 |
| 5,968,610 * | 10/1999 | Liu et al. | 438/435 |
| 5,981,355 * | 11/1999 | Lee | 438/424 |
| 6,004,863 * | 12/1999 | Jang | 438/427 |
| 6,030,881 * | 2/2000 | Papasouliotis et al. | 438/424 |
| 6,037,018 | 3/2000 | Jang et al. | 427/579 |

* cited by examiner

MANUFACTURE OF AN INTEGRATED CIRCUIT ISOLATION STRUCTURE

BACKGROUND OF THE INVENTION

The present invention relates to integrated circuit device manufacture, and more particularly, but not exclusively, relates to techniques to provide electrical isolation structures for an integrated circuit.

Shallow Trench Isolation (STI) is becoming a favored technology to electrically isolate regions of an integrated circuit having components with submicron critical dimensions. Generally, STI involves forming trenches in an integrated circuit substrate, then filling these trenches with a dielectric material. One approach has been to fill the trenches with Tetraethylorthosilicate (TEOS) using a Low Pressure Chemical Vapor Deposition (LPCVD) procedure as described, for example, in U.S. Pat. No. 5,691,215 to Dai et al. However, this approach tends to leave too many voids and other discontinuities as integrated circuits are scaled down to include components having a critical dimension equal to or less than 0.25 microns.

Consequently, other approaches have been investigated. For example, U.S. Pat. No. 5,728,621 to Zheng et al. describes a High Density Plasma (HDP) deposition of a dielectric material to fill isolation trenches. Still, one drawback of this approach is poor local planarity over topography of various sizes and pattern densities. Generally, HDP deposition results in a thicker material over large, expansive features between the trenches, and a thinner material over narrow trenches that may be narrowly spaced from one another. Due to this nonuniformity, subsequent planarization procedures, such as Chemical-Mechanical Polishing (CMP), frequently result in the advertent reduction in the thickness of a layer or film beneath the HDP material in regions where it is thin, or the failure to remove some of the HDP material in regions where it is thick.

One attempt to solve this problem has been a "reverse mask" scheme. This scheme includes placement of a mask over areas where the HDP material is thinner to selectively etch away the thicker regions until a generally uniform HDP material thickness results. The reverse mask is then removed and the device planarized to desired specifications. Unfortunately, the reverse mask process significantly complicates manufacturing, adding several device processing phases. Concomitantly, manufacturing costs generally increase. Thus, there is a demand for better techniques to provide isolation structures.

SUMMARY OF THE INVENTIONS

One form of the present invention is an improved integrated circuit device. An alternative form of the present invention is an improved process for providing an electronic device. This process may include a High Density Plasma (HDP) deposition to facilitate manufacture of an integrated circuit device.

A further alternative form is a technique to provide isolation structures on a device. For instance, this technique may be applied to form isolation structures along a substrate of an integrated circuit device. In another instance, this technique may include an improved process for filling substrate trenches with a dielectric to provide one or more isolation structures.

In another alternative form, the present invention includes forming a number of trenches in a substrate of a workpiece for making at least one integrated circuit. The trenches define a number of regions along the substrate to be electrically isolated from one another. The trenches are at least partially filled by simultaneously depositing and sputter etching a dielectric material with a deposition-to-etch (deposition:etch) ratio of at least about 5. More preferably, the deposition:etch ratio is in a range of about 5.5 to about 6.5. Most preferably, the deposition:etch ratio is in a range of about 5.8 to about 6.2. Further processing of the workpiece may include planarization.

Other alternative forms of the present invention include, but are not limited to, a technique for forming a number of trenches in an integrated circuit substrate that define a number of substrate regions to be electrically isolated from one another. A dielectric material is deposited in the trenches by exposure to a high density plasma having a first deposition-to-etch ratio. The high density plasma is adjusted to a second deposition-to-etch ratio greater than the first ratio to accumulate the dielectric material on the substrate after at least partially filling the trenches. A portion of the dielectric material is removed to planarize the workpiece.

In yet another alternative form, the present invention includes forming a number of trenches in an integrated circuit substrate and depositing a dielectric material in the trenches. The dielectric material may be provided by a high density plasma having a deposition-to-etch ratio of at least about 5. A number of circuit components may be provided along the substrate. In this form, deposition of the dielectric material may include depositing a TEOS dielectric after at least partially filling the trenches with the dielectric material by the high density plasma.

Further alternative forms of the present invention include controlling thickness variation of a coating on a device. This coating may be applied to uniformly fill and ameliorate unevenness of an underlying structure, such as a substrate having one or more trenches.

Still another alternative form includes providing a number of trenches in a workpiece and depositing a dielectric on the workpiece by exposing the workpiece to a high density plasma. The dielectric at least partially fills the trenches. The deposition includes establishing a thickness of the dielectric on the workplace with a maximum step height-to-thickness ratio of about 0.2. During further processing, the workpiece may be planarized by chemical-mechanical polishing.

Further objects, forms, embodiments, benefits, advantages, features, and aspects of the present invention shall become apparent from the description and drawings contained herein.

DESCRIPTION OF THE PREFERRED EMBODIMENTS

Figure 1:
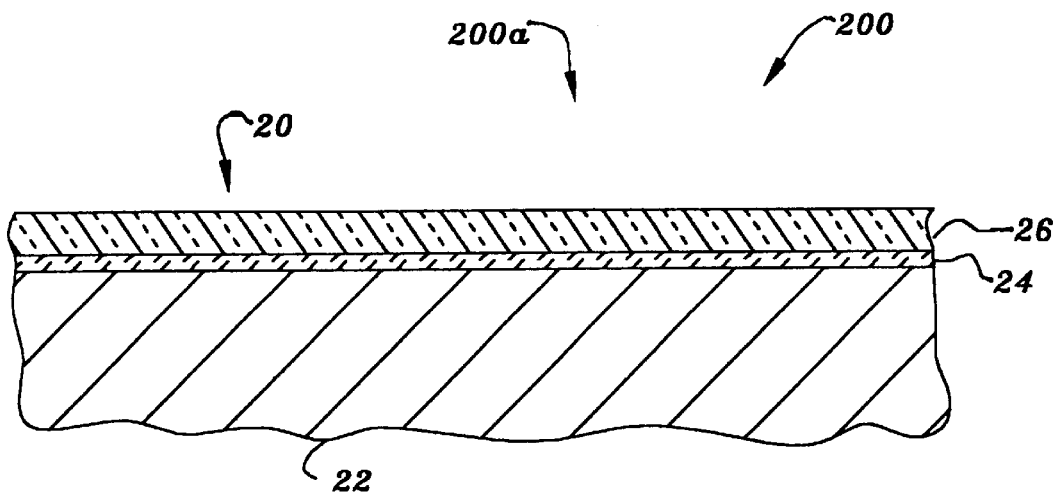
FIGS. 1–6 are partial, sectional views illustrating selected stages of a process of the present invention, with like reference numerals representing like features. In some cases, FIGS. 1–6 or selected features thereof are not drawn to scale to enhance clarity.

For the purposes of promoting an understanding of the principles of the invention, reference will now be made to the embodiments illustrated in the drawings and specific language will be used to describe the same. It will, nevertheless, be understood that no limitation of the scope of the invention is thereby intended. Any alterations and further modifications in the described embodiments and any further applications of the principles of the invention as described herein are contemplated as would normally occur to one skilled in the art to which the invention relates.

As used herein, the term "oxide of silicon" refers broadly to any material containing oxygen and silicon in any stoichiometric ratio, and may include one or more other elements. Furthermore, as used herein, the term "silicon nitride" refers broadly to any material containing silicon and nitrogen in any stoichiometric ratio, and may include one or more other elements. A chemical compound formula will be utilized herein to distinguish a specific compound stoichiometry.

FIGS. 1–6 illustrate selected progressive stages 200a–200f of one preferred embodiment of process 200 to provide an integrated circuit device. FIG. 1 depicts integrated circuit device workpiece 20 at an intermediate processing stage 200a. Workpiece 20 includes integrated circuit substrate 22. A first masking layer 24 is depicted on substrate 22 and a second masking layer 26 is depicted on layer 24. It is preferred that substrate 22 be generally planar and formed from a common semiconductor material such as a single-crystal silicon; however, other geometries, compositions, and arrangements of substrate 22 are also contemplated as would occur to those skilled in the art. As depicted, substrate 22 generally extends along a plane perpendicular to the viewplane of FIG. 1. It is also preferred that substrate 22 be initially p- or n-doped as appropriate for the particular type of semiconductor junctions desired to be formed within substrate 22 during later processing stages.

Layers 24 and 26 are formed from materials suitable to provide a hard mask for processing of substrate 22. In one preferred combination, layer 24 is comprised of an oxide of silicon and layer 26 is comprised of silicon nitride. More preferably, layer 24 includes silicon dioxide that is formed using a standard thermal oxidation technique, and has a thickness between about 50 and 300 angstroms. For layer 26, it is more preferred that it be formed by depositing silicon nitride with a low pressure chemical vapor deposition (LPCVD) technique or plasma enhanced chemical vapor deposition (PECVD) technique to a thickness of at least about 1,000 angstroms. In other embodiments, different compositions and formation techniques may be applied to provide layers 24 and 26 as would occur to those skilled in the art. In still other embodiments, one or more of layers 24 and 26 may be absent.

Figure 2:
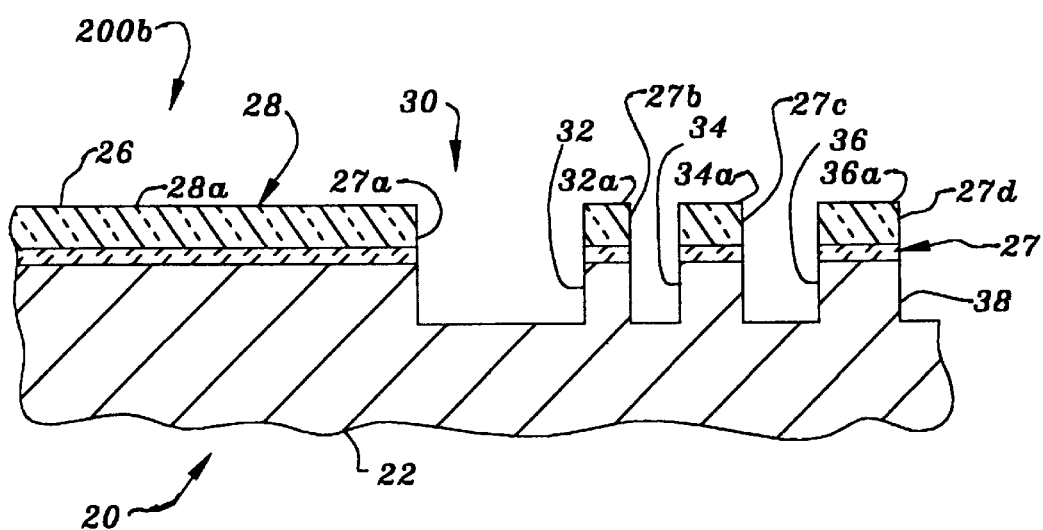

In transitioning from stage 200a of FIG. 1 to stage 200b of FIG. 2, layers 24, 26 are patterned to collectively form mask 27. Preferably, mask 27 is formed by applying a photoresist layer and photolithographically exposing it to a substrate trench pattern image that is subsequently developed. For a positive photoresist material, portions of the material corresponding to trenches are removed by this process, and an etching procedure, such as a reactive ion etch (RIE) technique, is used to transfer the resulting positive photoresist layer pattern to the underlying layers and substrate. For such a procedure, RIE chemistry may employ $CF_4$—$CHF_3$—Ar as an etch for layers 24 and 26 when they are comprised of silicon dioxide and silicon nitride, respectively. The formation of mask 27 from layers 24, 22, defines mask openings 27a, 27b, 27c, 27d. Substrate 22 is patterned using mask 27 to subsequently define active component region 28 and trench pattern 30. When substrate 22 is formed from silicon, an etch chemistry of HBr—$Cl_2$—$O_2$ may be utilized to provide pattern 30. Trench pattern 30 includes representative trenches 32, 34, 36, 38 intersecting openings 27a, 27b, 27c, 27d, respectively. Trench pattern 30 defines a number of small, narrow features 32a, 34a, 36a; while component region 28 corresponds to a large wide feature 28a. Selected dimensional relationships of features 28a, 32a, 34a, 36a may not be illustrated in proportion to enhance understanding of the present invention.

After formation of trench pattern 30, workpiece 20 is further processed by deposition of dielectric fill material 40a. Fill material 40a at least partially fills trenches 32, 34, 36, 38 of pattern 30 and preferably covers workpiece 20 including features 28a, 32a, 34a, and 36a. Preferably, material 40a includes silicon dioxide or is silica-based, and is formed from a high density plasma (HDP). In one embodiment, the equipment used to perform the preferred HDP deposition is model no. Ultima HDP-CVD supplied by Applied Materials, Inc. with a business address at 3050 Bowers Avenue, Santa Clara, Calif. 95054–3299. It is preferred that a deposition-to-etch ratio during the preferred HDP deposition be at least about 5. It is more preferred that the deposition-to-etch ratio be in a range of about 5.5 to about 6.5. It is most preferred that the deposition-to-etch ratio be in a range of about 5.8 to about 6.2. If a deposition-to-etch ratio of greater than 5 is insufficient to fill high aspect ratio topography, a two-step process with a lower deposition-to-etch ratio during the first step can be used. This lower deposition-to-etch ratio process can be used until the gaps are partially filled, and a higher deposition-to-etch ratio of at least 5 is used to complete the deposition.

It has been found that simultaneously depositing and sputter etching a dielectric material with a deposition-to-etch (deposition:etch) ratio in accordance with the present invention provides adequate fill of trenches without detrimental seams or voids. Indeed, it has been found that isolation trenches with widths below 300 nanometers may be suitably filled in this manner. Nonetheless, other embodiments of the present invention may not incorporate features corresponding to these findings, instead relating to one or more other forms, aspects or features.

Figures 3, 4:
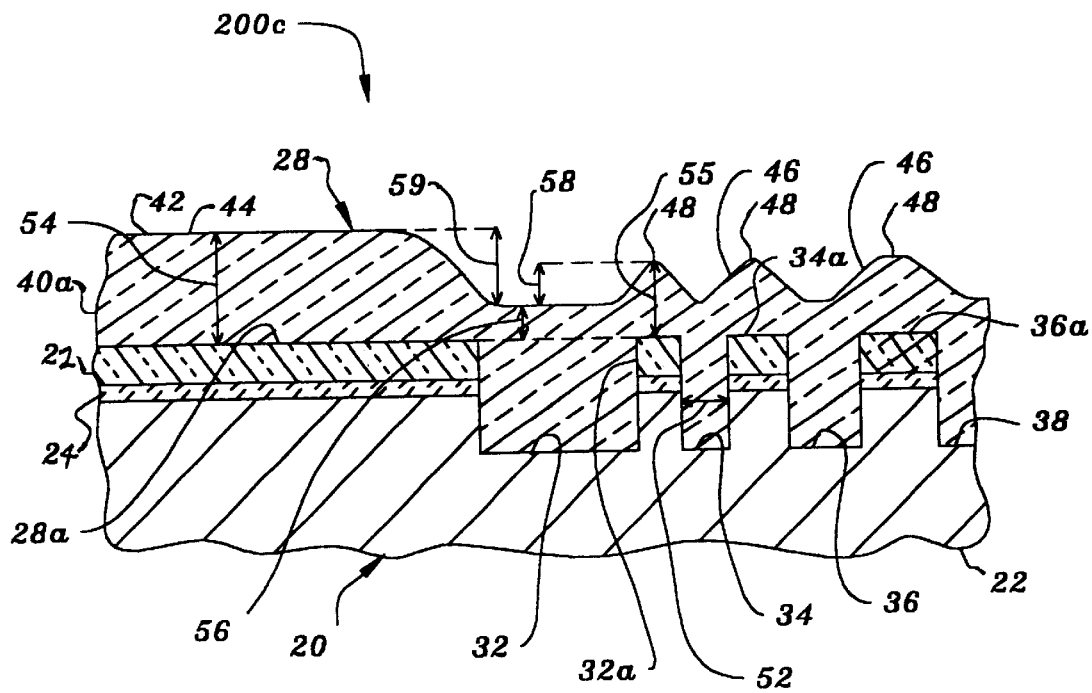

As depicted in intermediate stage 200c of FIG. 3, fill material 40a defines surface 42. Region 44 of surface 42 is generally flat and generally corresponds to a maximum thickness $T1_{max}$ of fill material 40a as represented by double-headed arrow 54. Region 44 covers feature 28a corresponding to component region 28. Surface 42 also has a generally uneven portion with troughs 46 over trenches 32, 34, 36, 38 and peaks 48 over features 32a, 34a, 36a. On peaks 48, fill material 40a has a maximum thickness $T2_{max}$ represented by double-headed arrow 55. Thickness $T2_{max}$ on peaks 48 is generally less than thickness $T1_{max}$ on region 44. Troughs 46 correspond to a minimum thickness $T1_{min}$ as represented by double-headed arrow 56. Double-headed arrow 58 represents the small feature fill material thickness difference or small feature "step height" designated as $\Delta 1$. Double-headed arrow 59 represents the large feature fill material thickness difference or large feature "step height" designated as $\Delta 2$. The difference between $\Delta 1$ and $\Delta 2$ ($\Delta 2 - \Delta 1$) is designated step height difference $\Delta 3$. In FIG. 3, a representative trench width TW is indicated by double-headed arrow 52.

It has been found that by increasing the deposition-to-etch ratio, $T2_{max}$ is desirably increased and correspondingly, $\Delta 3$ is decreased. At the same time, alteration of $T1_{max}$, $T1_{min}$, and $\Delta 2$ (if any) due to the higher deposition-to-etch ratio is not as significant. Accordingly, $\Delta 1$ increases and $\Delta 3/\Delta 1$ decreases. In one embodiment, $\Delta 1$ and $\Delta 2$ are approximately the same, such that $\Delta 3$ approaches zero. In other embodiments, $\Delta 3$ is reduced, but a difference between $\Delta 1$ and $\Delta 2$ is maintained.

The small feature step height-to-thickness ratio HTR1 at stage 200c is given by $\Delta 1/T2_{max}$ (HTR1=$\Delta 1/T2_{max}$). This measure of variation increases with the increase of Δ1, which is often desired to improve the outcome of subsequent processing, as more fully described hereinafter.

In stage 200d of FIG. 4, workpiece 20 has been further processed by applying coating 40b on material 40a. Preferably, coating 40b is a continued application of silica-based material to further increase the collective thickness of material 40a, 40b in a manner which reduces overall thickness variation. More preferably, an HDP deposition is utilized to form coating 40b with a deposition-to-etch ratio of at least 6.0:1 (deposition:etch). Collectively, material 40a and coating 40b define fill and coating layer 60. Notably, fill material 40a and coating 40b may not be clearly distinct from one another, but may represent the gradual transition of selected parameters utilized in an HDP deposition such as might occur with a gradual change in the deposition-to-etch ratio. Relative to fill material 40a alone, layer 60 has a generally more even upper surface 62. Surface 62 defines region 64 of layer 60 that covers component region 28. Surface 62 also defines an uneven portion with troughs 66 over trenches 32, 34, 36, 38; and peaks 68 over features 32a, 34a, 36a.

Double-headed arrow 74 represents the maximum thickness $T3_{max}$ of layer 60 on region 64. Double-headed arrow 75 represents the maximum thickness $T4_{max}$ of layer 60 on peaks 68. Typically, $T4_{max}$ is less than or equal to $T3_{max}$. The minimum thickness is designated $T2_{min}$ and represented by double-headed arrow 76. Double-headed arrow 78 represents the small feature step height Δ4 and double-headed arrow 79 represents large feature step height Δ5. The step height difference for layer 60 is represented by Δ6 (Δ6=Δ5−Δ4). Typically, Δ4, Δ5, Δ6 are about the same as Δ1, Δ2, Δ3, respectively. However, in alternative embodiments, one or more of Δ4, Δ5, Δ6 may be different from the respective Δ1, Δ2, Δ3.

For layer 60, the small feature step height-to-thickness ratio HTR2 is given by $\Delta 4/T4_{max}$ (HTR2=$\Delta 4/T4_{max}$). Generally, HTR2 is less than HTR1 because of the greater thickness of layer 60 relative to material 40a alone.

In one preferred embodiment having trench widths (TWs) of less than 300 nanometers, the corresponding value of $T3_{max}$ is about 500 nanometers. In another preferred embodiment, fill material 40a is deposited to establish a thickness variation HTR1 of no more than about 0.5. In a more preferred embodiment, coating 40b is applied to material 40a to provide an HTR2 of no more than about 0.2. Naturally, in other embodiments, different values of TW, $T1_{max}$, $T1_{min}$, $T2_{max}$, $T2_{min}$, $T3_{max}$, $T4_{max}$, Δ1, Δ2, Δ3, Δ4, Δ5, Δ6, HTR1 and HTR2 may be obtained in accordance with the teachings of the present invention.

In one alternative embodiment, coating 40b is not an HDP deposited silica-based material. Instead, for this embodiment, coating 40b is formed by a low pressure chemical vapor deposition (LPCVD) of a dielectric including tetraethylorthosilicate (TEOS). In one application, TEOS is applied as coating 40b to a thickness of at least 500 nanometers.

Indeed, it is envisioned that numerous compositional variations of layer 60 may be practiced in accordance with the present invention to reduce thickness unevenness, such as that measured by HTR2. As an alternative to forming layer 60 with a changing HDP deposition-to-etch ratio, layer 60 may be formed by HDP deposition utilizing a generally constant deposition-to-etch ratio. In other alternative embodiments, layer 60 may consist of two or more materials, constituents, films, or coatings of either a continuous or discontinuous form.

Figure 5:
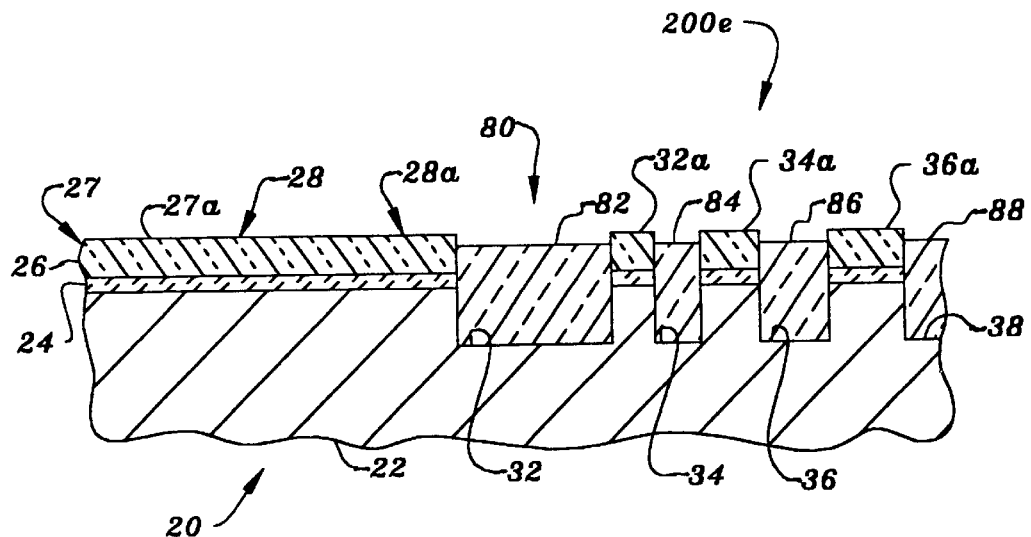

Workpiece 20 is further processed after stage 200d to provide the form illustrated at stage 200e in FIG. 5. This additional processing includes planarization of layer 60 until the upper portion 27a of mask 27 is re-exposed. Preferably, planarization includes Chemical-Mechanical Polishing (CMP) in a manner compatible with the removal of the one or more constituents of layer 60. After planarization down to mask 27, filled trench pattern 80 results, having isolation structure surfaces 82, 84, 86, 88 that are positioned slightly below the re-exposed features 28a, 32a, 34a, 36a.

It has been found that by increasing the small feature step height-to-thickness ratio HTR1 of fill material 40a such that it is closer to $\Delta 2/T1_{max}$ than conventional schemes (e.g., reducing Δ3), and accordingly changing the small feature step height-to-thickness ratio HTR2 of layer 60, that the time spent planarizing an irregularly contoured surface of layer 60 is proportionally reduced. As a result, the degree of planarity upon reaching mask 27 may be increased. Indeed, the thickness of coating 60 may be adjusted to provide a desired step height-to-thickness ratio empirically determined to provide an acceptable degree of planarity upon re-exposure of mask 27. At the same time, it is preferred that the thickness of layer 60 not be so great as to needlessly extend the planarization operation. Thus, for a given geometric and compositional arrangement, the preferred absolute thickness will typically vary. For one preferred embodiment of the present invention, it has been found that a step height-to-thickness ratio of less than or equal to about 0.2 provides desirable results; however, for other embodiments a step height-to-thickness ratio greater then 0.2 is acceptable.

Providing a desired thickness of layer 60 may be accomplished in several ways in accordance with the present invention. For example, when an HDP deposition is utilized, deposition:etch ratio, deposition rate, or both may be controlled to provide a desired thickness. For the embodiment where layer 60 includes TEOS, the thickness of layer 60 may additionally or alternatively be adjusted by controlling the TEOS deposition. In other embodiments, the thickness of layer 60 may be regulated and controlled using such techniques as would occur to those skilled in the art with reference to the particular constituents of layer 60. In still other embodiments, the thickness of layer 60 may not be of concern, instead relating to one or more other forms, aspects, or features of the present invention.

Figure 6:
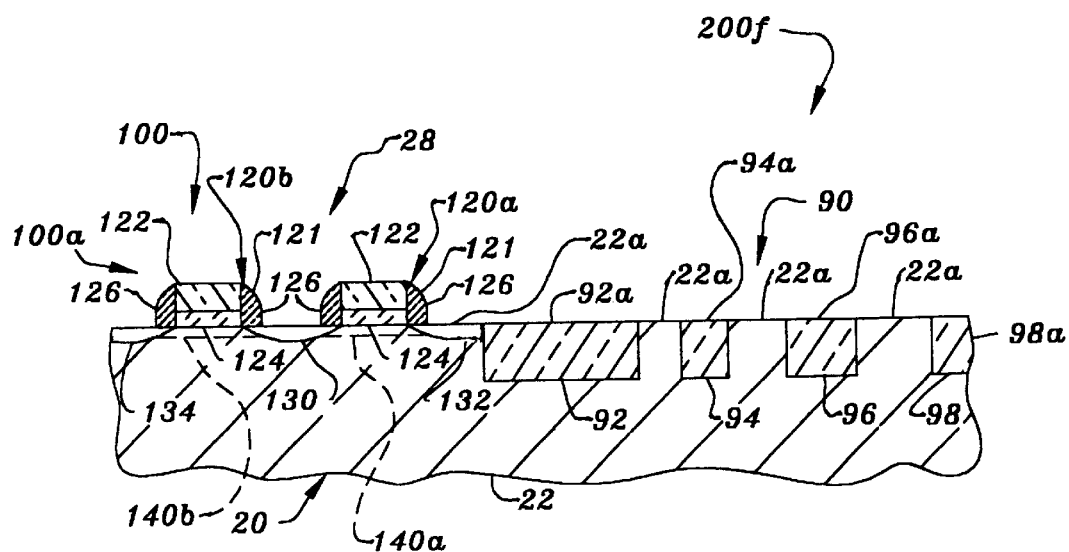

After stage 200e, device 20 is further processed to provide the form presented at stage 200f in FIG. 6. This processing includes removal of mask 27 to re-expose substrate 22. For the preferred mask composition combination of a silica-based layer 24 and a silicon nitride layer 26, mask 27 is preferably removed by a wet processing technique consisting of a sequence of hydrofluoric and (HF), phosphoric acid ($H_3PO_4$), followed by hydrofluoric acid (HF) again.

Device 20 is then further planarized to provide electrical isolation structures 90 in the form of filled isolation trenches 92, 94, 96, 98. Filled isolation trenches 92, 94, 96, 98 have generally planar surfaces 92a, 94a, 96a, 98a, respectively, that are approximately coplanar with substrate surface 22a after planarization. In other embodiments, surfaces of isolation structures 90 may be left to protrude or extend above substrate surface 22a.

In stage 200f, device 20 also includes components 100 formed in component region 28 to provide integrated circuit 100a (partially shown). Components 100 include insulated gate field effect transistors (IGFETs) 120a, 120b. IGFETs 120a, 120b have corresponding gate structures 121 extending away from substrate 22. Each structure 121 includes conductive gate member 122, dielectric gate pad 124, and a pair of opposing sidewall spacers 126. Preferably, gate member 122 is comprised of a doped polycrystalline silicon (also designated as "poly" or "polysilicon"). It is also preferred that pad 124 be formed from a standard gate oxide and spacers 126 be formed from a dielectric material such as an oxide of silicon or silicon nitride. Preferably, structures 121 are formed using standard techniques known to those skilled in the art. Substrate 22 is doped differently in selected regions to define desired semiconductor junctions for IGFETs 120a, 120b. Doped substrate region 130 defines a source/drain that is shared by IGFETs 120a, 120b. Also, doped substrate region 132 defines a separate source/drain for IGFET 120a, and doped substrate region 134 defines a separate source/drain for IGFET 120b.

Regions 130, 132, 134 are preferably formed by selectively implanting substrate 22 with an appropriate n+ or p+ dopant having a conductivity type opposite a p- or n-dopant desired for substrate channel regions 140a, 140b beneath pads 124 of IGFETs 120a, 120b, respectively. Regions 130, 132, 134 may be formed to provide lightly doped drain (LDD) areas beneath spacers 126 using techniques known to those skilled in the art. Preferably, IGFETs 120a, 120b each have a critical dimension of 0.25 micron or less.

After stage 200f, workpiece 20 may be further processed to complete it for use as an integrated circuit device. In one embodiment, electrical contacts are selectively formed with components 100 after stage 200f. Connection areas may be formed along silicon surfaces by depositing an appropriate metal layer, such as tungsten (W), titanium (Ti), cobalt (Co), tantalum (Ta), or platinum (Pt) in contact therewith. Workpiece 20 is then annealed as appropriate to form a silicide/polycide film using techniques known to those skilled in the art. One or more metallization layers may be fabricated to selectively contact and interconnect components 100, and external contact pads may be established for electrical interconnection to other devices. Workpiece 20 may be a part of a semiconductor wafer that is separated into a number of individual integrated circuit chips after performance of selected manufacturing operations. After electrical interconnections are formed, packaging may take place, including the formation of external electrical interconnections, such as wire bonds, with any established contact pads as appropriate.

It should be understood that workpiece 20 is illustrated in a partial view that shows only a few representative integrated circuit components 100—namely transistors 120a, 120b. Other embodiments may have a greater quantity or variety of integrated circuit components than depicted; however, illustrating such additional features would needlessly complicate the figures. Similarly, different active or passive integrated circuit component types as would occur to those skilled in the art may additionally or alternatively be included, but have not been specifically described to enhance clarity. Further, a different number, arrangement, or spacing of isolation structures 90 may be utilized in other embodiments as would occur to those skilled in the art. Indeed, in one preferred embodiment it is envisioned that many more isolation structures 90 will be utilized to define a corresponding number of active component areas along substrate 22.

Also, other types of isolation structures may be mixed or combined with those of the present invention. In another non-limiting aspect, the teachings of the present invention may be applied to any device where an isolation structure is desired. Indeed, in other alternative embodiments, isolation structures in accordance with the present invention are applied to form a different type of device such as one not intended to have a integrated circuit, or to provide a device that may lack any conventional components or circuitry.

It should be noted that implementation of the disclosed embodiments of the present invention is not limited to the depicted process flows in the figures. It is understood that preparation of devices in accordance with the present invention may be incorporated in other process flows known to those skilled in the art. Moreover, processes of the present invention may be altered, rearranged, substituted, deleted, duplicated, combined, or added to other processes as would occur to those skilled in the art without departing from the spirit of the present invention. Additionally or alternatively, the various stages, procedures, techniques, phases, and operations within these processes may be altered, rearranged, substituted, deleted, duplicated, or combined as would occur to those skilled in the art.

All publications, patents, and patent applications cited in this specification are herein incorporated by reference as if each individual publication, patent, or patent application was specifically and individually indicated to be incorporated by reference and set forth in its entirety herein. Furthermore, it is not intended that the present invention be limited to any expressed theory or mechanism of operation provided herein. While the invention has been illustrated and described in detail in the drawings and foregoing description, the same is considered to be illustrative and not restrictive in character, it is understood that only the preferred embodiments have been shown and described and that all changes, modifications and equivalents that come within the spirit of the invention as defined by the following claims are desired to be protected.

What is claimed is:

1. A method, comprising:
   forming a number of trenches in a substrate of a workpiece for making at least one integrated circuit,
   the trenches defining a number of regions along the substrate to be electrically isolated from one another;
   at least partially filling the trenches by simultaneously depositing and sputter etching a dielectric material with a deposition-to-etch ratio of at least about 5; and
   chemically-mechanically polishing the workpiece.

2. The method of claim 1, wherein the ratio is in a range of about 5.5 to about 6.5.

3. The method of claim 2, wherein the ratio is in a range of about 5.8 to about 6.2.

4. The method of claim 1, further comprising depositing another dielectric material after said at least partially filling and before said chemically-mechanically polishing.

5. The method of claim 1, further comprising:
   depositing a first dielectric layer on the substrate;
   depositing a second dielectric layer on the first dielectric layer; and
   wherein said forming includes patterning the first and second dielectric layers to provide the trenches.

6. The method of claim 5, wherein the substrate is formed from a single-crystal silicon, the first dielectric layer is comprised of an oxide of silicon, the second dielectric layer is comprised of silicon nitride, and the dielectric material is a silica-based compound.

7. The method of claim 5, further comprising:
   covering the workpiece with a dielectric coating before said chemically-mechanically polishing, said dielectric coating at least partially being formed by the dielectric material;

establishing a minimum thickness of the dielectric coating in correspondence with a desired degree of planarity of the workpiece; and completing formation of a number of insulated gate field effect transistors along the workpiece, the transistors each having a critical dimension no more than about 0.25 micron.

8. A method, comprising:

forming a number of trenches in an integrated circuit substrate;

depositing a dielectric material in the trenches, the dielectric material being provided by a high density plasma having a deposition-to-etch ratio of at least about 5;

providing a number of circuit components along the substrate; and removing at least a portion of the dielectric material by chemical-mechanical polishing.

9. The method of claim 8, wherein the substrate defines a number of regions electrically isolated from one another by the trenches when the trenches are each at least partially filled with the dielectric material.

10. The method of claim 8, wherein the ratio is in a range of about 5.5 to about 6.5.

11. The method of claim 10, wherein the ratio is in a range of about 5.8 to about 6.2.

12. The method of claim 10, wherein said depositing includes depositing a TEOS dielectric after at least partially filling the trenches with the dielectric material by the high density plasma.

13. The method of claim 10, further comprising:

depositing a first layer comprised of an oxide of silicon on the substrate before said forming; and depositing a second layer comprised of silicon nitride on the first layer before said forming.

14. A method, comprising:

forming a number of trenches in an integrated circuit substrate, the trenches defining a number of substrate regions to be electrically isolated from one another;

depositing a dielectric material in the trenches by exposure to a high density plasma having a first deposition-to-etch ratio;

adjusting the high density plasma to a second deposition-to-etch ratio greater than the first ratio to accumulate the dielectric material on the substrate after at least partially filling the trenches; and removing a portion of the dielectric material to planarize the workpiece.

15. The method of claim 14, further comprising completing formation of a number of circuit components along the substrate.

16. The method of claim 14, wherein the first ratio is at least 5.

17. The method of claim 14, wherein the first ratio is in a range of about 5.5 to about 6.5.

18. The method of claim 14, further comprising:

depositing a first layer comprised of an oxide of silicon on the substrate before said forming;

depositing a second layer comprised of silicon nitride on the first layer before said forming; and wherein said forming includes patterning the first layer and the second layer to define the trenches, the trenches each passing through a respective opening in the first layer and the second layer.

19. The method of claim 14, wherein said removing is performed by chemical-mechanical polishing.

20. The method of claim 8, further comprising covering the dielectric material that at least partially fills the trenches with a different material.

21. The method of claim 20, wherein said different material includes TEOS.

22. The method of claim 14, wherein a portion of the dielectric material deposited by exposure to the high density plasma having the first deposition-to-etch ratio fills one or more of the trenches.

23. A method, comprising:

forming a number of trenches in a substrate of a workpiece;

at least partially filling the trenches with a first dielectric material, the first dielectric material being provided by a high density plasma having a deposition-to-etch ratio of at least about 5;

depositing a second dielectric material on the first dielectric material, the second dielectric material having a different composition than the first dielectric material;

planarizing the workpiece after said depositing; and providing a number of integrated circuit components along the substrate.

24. The method of claim 23, wherein said planarizing includes chemical-mechanical polishing of the workpiece.

25. The method of claim 23, wherein the second dielectric material includes TEOS.

26. The method of claim 23, wherein the ratio is in a range of about 5.5 to about 6.5.

27. The method of claim 23, wherein said planarizing includes chemical-mechanical polishing of the workpiece, and further comprising establishing a minimum thickness of the second dielectric material in correspondence with a desired degree of planarity of the workpiece to be provided by said planarizing.

* * * * *